(12) United States Patent
Chae et al.

(10) Patent No.: US 10,942,450 B2
(45) Date of Patent: Mar. 9, 2021

(54) INORGANIC NANOPARTICLE STRUCTURE, FILM, OPTICAL MEMBER, LIGHT-EMITTING DEVICE, AND LIQUID CRYSTAL DISPLAY APPARATUS HAVING THE SAME

(71) Applicant: RESEARCH & BUSINESS FOUNDATION SUNGKYUNKWAN UNIVERSITY, Suwon-si (KR)

(72) Inventors: Heeyeop Chae, Suwon-si (KR); Chang Min Lee, Suwon-si (KR); Hee Young Kim, Suwon-si (KR); Woo Suk Lee, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 314 days.

(21) Appl. No.: 16/036,717

(22) Filed: Jul. 16, 2018

(65) Prior Publication Data

US 2019/0025696 A1  Jan. 24, 2019

(30) Foreign Application Priority Data

Jul. 18, 2017 (KR) .................... 10-2017-0091066

(51) Int. Cl.
| | | |
|---|---|---|
| *C09K 11/00* | (2006.01) | |
| *G03F 7/031* | (2006.01) | |
| *C09K 11/06* | (2006.01) | |
| *C09K 11/62* | (2006.01) | |
| *G03F 7/16* | (2006.01) | |
| *H01L 51/50* | (2006.01) | |
| *G03F 7/32* | (2006.01) | |
| *H01L 51/00* | (2006.01) | |
| *G03F 7/20* | (2006.01) | |
| *G03F 7/004* | (2006.01) | |
| *G03F 7/027* | (2006.01) | |
| *H01L 27/32* | (2006.01) | |

(52) U.S. Cl.
CPC .............. *G03F 7/031* (2013.01); *C09K 11/06* (2013.01); *C09K 11/62* (2013.01); *G03F 7/0047* (2013.01); *G03F 7/027* (2013.01); *G03F 7/162* (2013.01); *G03F 7/168* (2013.01); *G03F 7/2004* (2013.01); *G03F 7/325* (2013.01); *H01L 51/004* (2013.01); *H01L 51/009* (2013.01); *H01L 51/0079* (2013.01); *H01L 51/0092* (2013.01); *H01L 51/502* (2013.01); *H01L 27/322* (2013.01); *H01L 2251/5369* (2013.01)

(58) Field of Classification Search
CPC ....... C09K 11/025; C09K 11/08; C09K 11/62; B82Y 20/00; B82Y 40/00; H01L 51/502; H01L 33/502; H01L 27/322; G03F 7/0007; G03F 7/027; G03F 7/031; G03F 7/038
USPC ................................... 430/7, 281.1
See application file for complete search history.

(56) References Cited

U.S. PATENT DOCUMENTS

| | | | | |
|---|---|---|---|---|
| 2004/0091710 A1* | 5/2004 | Bawendi | .................. | C01G 9/08 428/407 |
| 2008/0272347 A1* | 11/2008 | Fukuda | ................. | G03F 7/0007 252/586 |
| 2010/0113813 A1* | 5/2010 | Pickett | ................... | B82Y 30/00 556/9 |
| 2017/0183567 A1* | 6/2017 | Zhou | ....................... | G03F 7/027 |
| 2019/0241804 A1* | 8/2019 | Aboulaich | ............. | C09K 11/08 |

* cited by examiner

*Primary Examiner* — John A McPherson
(74) *Attorney, Agent, or Firm* — NSIP Law

(57) ABSTRACT

An inorganic nanoparticles-based structure in accordance with the present disclosure includes inorganic nano-particles; and a novel ligand coordinated to a surface of each of the inorganic nano-particles, wherein the ligand has a urethane bond resulting from reaction with an isocyanate compound having a double bond, and, thus, has a double bond at terminals thereof. Further, the present disclosure provides an optical member, a light-emitting device, and a quantum dot display device including the inorganic nanoparticles-based structure.

7 Claims, 1 Drawing Sheet

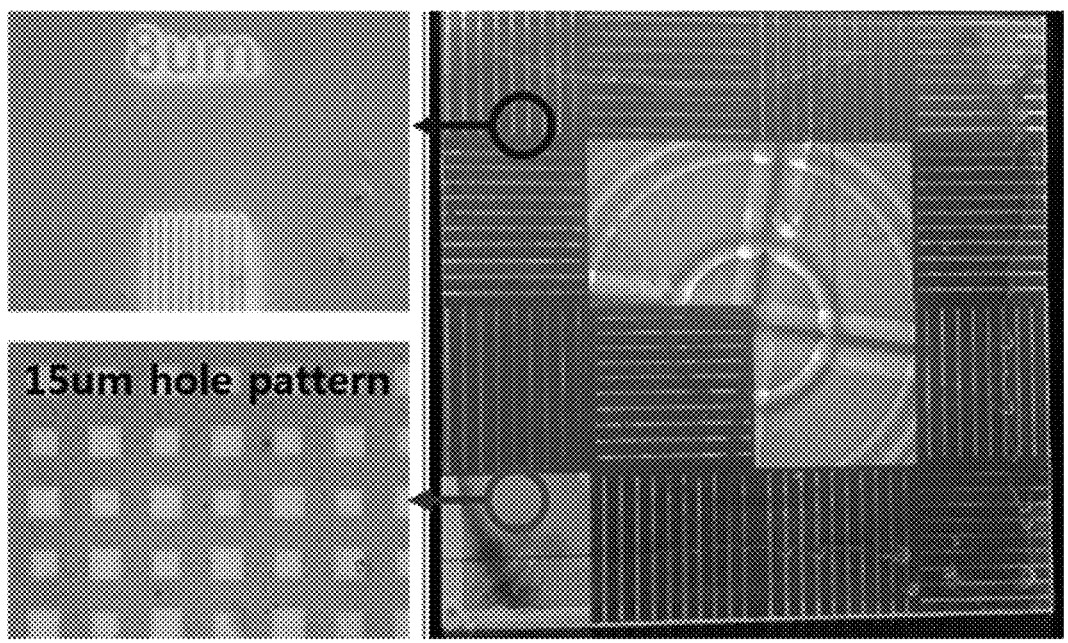

INORGANIC NANOPARTICLE STRUCTURE, FILM, OPTICAL MEMBER, LIGHT-EMITTING DEVICE, AND LIQUID CRYSTAL DISPLAY APPARATUS HAVING THE SAME

CROSS-REFERENCE TO RELATED APPLICATIONS

This application claims the priority of Korean Patent Application No. 10-2017-0091066 filed on Jul. 18, 2017, in the Korean Intellectual Property Office, the disclosure of which is hereby incorporated by reference in its entirety.

BACKGROUND

1. Technical Field

The present disclosure relates to an inorganic nanoparticles-based structure, and, a film, an optical member, a light-emitting device, and a quantum-dot display device including the structure. More particularly, the present disclosure relates to an inorganic nanoparticles-based structure having improved curability, and, a film, an optical member, a light-emitting device, and a quantum-dot display device including the structure.

2. Description of the Related Art

A liquid crystal device (LCD) converts various electrical information into visual information using a change in liquid crystal transmittance according to a voltage applied to the liquid crystal device (LCD). The liquid crystal device has no self-luminescence and require a backlight. However, LCDs are widely used because they may be implemented in a lightweight manner, in a thin form and using a low power consumption.

The liquid crystal device has no self-luminescence and thus includes a backlight unit (BLU), as a light emitting device, which provides light at a back of a display panel to display an image. The liquid crystal devices may be depending on a position of a light emitting diode (LED) as a light source.

There is disclosed a technique in which a blue light emitting diode is used as a light source for a backlight unit, and, inorganic nano-particles receive the blue light and emit red light and green light to mixing them to output white light to a display panel. Alternatively, there is disclosed a technique in which blue, green, and red inorganic nano-particles are stacked to render white light as backlight. In this connection, white light rendered using the luminescent inorganic nano-particles has high luminance and excellent color reproducibility. In connection with application of the luminescent inorganic nano-particles, patterned quantum dots as and films are disposed not as the backlight unit but are disposed in front of the display panel. In addition, techniques for fabricating electroluminescent diodes using solution processes such as inkjet or photolithography have been developed. In this connection, there is a problem that, after pattern formation, the pattern may be collapsed by loading of a solution coated on the pattern.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

A purpose of the present disclosure is to provide an inorganic nanoparticles-based structure having improved curability by introducing a specific ligand having a double bond onto a surface of each of the inorganic nanoparticles emitting visible light. In this connection, the inorganic nanoparticles-based structure according to the present disclosure may be cured using only photo-initiators or thermal-initiators without other compounds.

Another purpose of the present disclosure is to provide a quantum dot pattern, an optical member, a light emitting device, and a liquid crystal display device including the above-described inorganic nanoparticles-based structure including the ligand coordinated to the surface of each of the inorganic nanoparticles.

The purposes of the present disclosure are not limited to the above-mentioned purposes. Other purposes and advantages of the present disclosure, as not mentioned above, may be understood from the following descriptions and more clearly understood from the embodiments of the present disclosure. Further, it will be readily appreciated that the objects and advantages of the present disclosure may be realized by features and combinations thereof as disclosed in the claims.

In one aspect of the present disclosure, there is provided an inorganic nanoparticles-based structure including inorganic nano-particles; and ligands coordinated to surfaces of the inorganic nano-particles, wherein each of the ligands includes a component having a structure represented by a following chemical formula 1:

[Chemical formula 1]

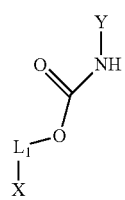

where X represents —SH, —P═OO, —C═OO or —HN$_2$;

L$_1$ represents an alkylene group having 1 to 20 carbon atoms, a cycloalkyl group having 3 to 15 carbon atoms, an aryl group having 3 to 15 carbon atoms, or a heteroarylene group having 3 to 15 carbon atoms;

at least one hydrogen atom of the alkylene group is substituted or unsubstituted with a cycloalkyl group having 3 to 15 carbon atoms, an aryl group having 3 to 15 carbon atoms, or a heteroarylene group having 3 to 15 carbon atoms;

Y represents a following chemical formula 2 or chemical formula 3:

[Chemical Formula 2]

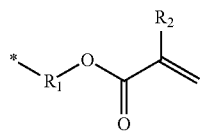

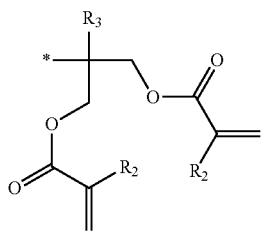

[Chemical Formula 3]

in the chemical formulas 2 and 3, $R_1$ represents an alkylene group having 1 to 20 carbon atoms;

$R_2$ and $R_3$ each independently represents hydrogen, an alkyl group having 1 to 10 carbon atoms or an aryl group having 3 to 15 carbon atoms.

In one embodiment of the inorganic nanoparticles-based structure, a content of the component represented by the chemical formula 1 is in a range of about 1 wt % to about 95 wt % with respect to a total weight of the ligand.

In one embodiment of the inorganic nanoparticles-based structure, the inorganic nanoparticle has a diameter of 0.5 nm to 40 nm.

In another aspect of the present disclosure, there is provided a thin film, wherein the film is formed by exposing, to light, a mixture between the inorganic nanoparticles-based structure as defined above and photo-initiator.

In another aspect of the present disclosure, there is provided an optical member comprising the inorganic nanoparticles-based structure as defined above.

In still another aspect of the present disclosure, there is provided a light-emitting device comprising the inorganic nanoparticles-based structure as defined above.

In still yet aspect of the present disclosure, there is provided a liquid crystal display device comprising the inorganic nanoparticles-based structure as defined above.

In still yet aspect of the present disclosure, there is provided a quantum dot display device comprising the inorganic nanoparticles-based structure as defined above.

Effects of the present disclosure may be as follows but be limited thereto.

The inorganic nanoparticles-based structure according to the present disclosure has excellent curability. Using the inorganic nanoparticles-based structure according to the present disclosure may solve the problem that the pattern is collapsed by the solution coated after the pattern formation in the prior art.

The inorganic nanoparticles-based structure according to the present disclosure as illustrated above may include the ligand coordinated to the surfaces of the inorganic nanoparticles, wherein the ligand may include the component having the structure represented by the chemical formula 1 in addition to the conventional stabilizing compound. Thus, this may improve compatibility of the inorganic nanoparticles-based structure to many applications thereof.

In the synthesis of the inorganic nano-particles, a compound having an alcohol group and a compound having a thiol group are introduced as a ligand material. Then, a separately-synthesized compound may react with the alcohol group on the inorganic nano-particles surface to form a new ligand structure with a urethane bond.

In other words, each of the thin film, optical member, light emitting device, electroluminescent diode and quantum dot display device according to the present disclosure may include the inorganic nanoparticles-based structures, wherein the inorganic nanoparticles-based structure has a novel ligand having a urethane bond resulting from the reaction with an isocyanate compound having a double bond, and, thus, having a double bond at terminals thereof.

This ligand modification alter may the property of the inorganic nanoparticle to be adapted to the application thereof. In particular, the compatibility thereof with other compositions may be increased when the inorganic nanoparticles-based structure is used to form a film. Further, when producing a light emitting diode, more smooth flow of electric charge may be induced in the inorganic nanoparticles-based structure.

The thin film may include the inorganic nanoparticles-based structure according to the present disclosure, wherein the inorganic nanoparticles-based structure includes the inorganic nanoparticles, and the ligand coordinated onto the surfaces of the inorganic nanoparticles, wherein the ligand contains the component having the structure represented by the chemical formula 1. Thus, the film may be curable only using the photo-initiator alone and, thus, the curability thereof may be excellent. Thus, the pattern manufactured using the photo mask may be not collapsed in the film formation.

The optical member, light emitting device and quantum dot display device according to the present disclosure may be produced. Each of the optical member, the light emitting device and the quantum dot display device according to the present disclosure may include the inorganic nanoparticles-based structure according to the present disclosure, wherein the inorganic nanoparticles-based structure includes the inorganic nanoparticles, and the ligand coordinated onto the surfaces of the inorganic nanoparticles, wherein the ligand contains the component having the structure represented by the chemical formula 1. Thus, each of the optical member, the light emitting device and the quantum dot display device may be curable only using the photo-initiator alone and, thus, the curability thereof may be excellent. Thus, the pattern thereof manufactured using the photo mask may be not collapsed.

Particularly, in the inorganic nanoparticle-based structure in accordance with the present disclosure, the ligand having the double bond is coordinated on the surface of the inorganic nanoparticle, thereby improving the curability of the structure. Thus, the structure may be cured using only a photo-initiator or a thermal-initiator.

Moreover, particularly, the inorganic nanoparticles-based structure according to the present disclosure may be easily mixed and uniformly dispersed in the polymer solution used to form the film. This may allow easy producing of the film having the light conversion property. Furthermore, the inorganic nanoparticles-based structure according to the present disclosure may be stably applied to the light-emitting device that renders white light.

Further specific effects of the present disclosure as well as the effects as described above will be described in conduction with illustrations of specific details for carrying out the invention.

BRIEF DESCRIPTION OF DRAWINGS

FIG. 1 shows a pattern produced according to one embodiment of the present disclosure.

DETAILED DESCRIPTION

Descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, and components have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure."

An inorganic nanoparticles-based structure according to the present disclosure may include inorganic nano-particles; and ligands coordinated to surfaces of the inorganic nano-particles, wherein each of the ligands includes a component having a structure represented by a following chemical formula 1:

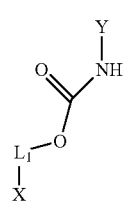

[Chemical formula 1]

where X represents —SH, —P=OO, —C=OO or —HN$_2$;

L$_1$ represents an alkylene group having 1 to 20 carbon atoms, a cycloalkyl group having 3 to 15 carbon atoms, an aryl group having 3 to 15 carbon atoms, or a heteroarylene group having 3 to 15 carbon atoms;

at least one hydrogen atom of the alkylene group is substituted or unsubstituted with a cycloalkyl group having 3 to 15 carbon atoms, an aryl group having 3 to 15 carbon atoms, or a heteroarylene group having 3 to 15 carbon atoms;

Y represents a following chemical formula 2 or chemical formula 3:

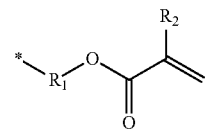

[Chemical Formula 2]

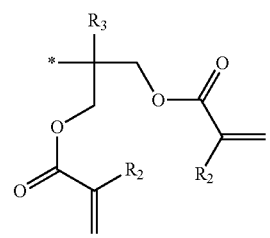

[Chemical Formula 3]

in the chemical formulas 2 and 3,

R$_1$ represents an alkylene group having 1 to 20 carbon atoms;

R$_2$ and R$_3$ each independently represents hydrogen, an alkyl group having 1 to 10 carbon atoms or an aryl group having 3 to 15 carbon atoms.

In each of the chemical formulas 1 to 3, * indicates a joint with the same or different repeating unit.

A material of the inorganic nano-particle may be selected from a group consisting of a Group II-VI compound, a Group II-V compound, a Group III-V compound, a Group III-IV compound, a Group III-VI compound, a Group IV-IV compound, or a mixture thereof.

The mixture includes a simple mixture of the above compounds, a ternary compound, a quaternary compound, and a mixture doped with a dopant.

An example of the Group II-VI compound may include magnesium sulfide (MgS), magnesium selenide (MgSe), magnesium telluride (MgTe), calcium sulfide (CaS), calcium selenium (CaSe), calcium telluride (CaTe), strontium sulfide (SrS), strontium selenide (SrSe), strontium telluride (SrTe), cadmium sulfide (CdS), cadmium selenide (CdSe), tellurium cadmium (CdTe), zinc sulfide (ZnS), zinc selenide (ZnSe), zinc telluride (ZnTe), mercury sulfide (HgS), mercury selenide (HgSe) or mercury telluride (HgTe), etc.

An example of the Group II-V compound may include zinc phosphide (Zn$_3$P$_2$), zinc arsenide (Zn$_3$As$_2$), cadmium phosphide (Cd$_3$P$_2$), cadmium arsenide (Cd$_3$As$_2$), cadmium nitride (Cd$_3$N$_2$) or zinc nitride (Zn$_3$N$_2$), etc.

An example of the Group III-V compound may include boron phosphide (BP), aluminum phosphide (ALP), aluminum arsenide (AlAs), aluminum antimonide (AlSb), gallium nitride (GaN), gallium phosphide (GaP), gallium arsenide (GaAs), gallium antimonide (GaSb), indium nitride (InN), indium phosphide (InP), indium arsenide (InAs), indium antimonide (InSb), aluminum nitride (AlN) or boron nitride (BN), etc.

An example of the Group III-IV compound may include boron carbide ($B_4C$), aluminum carbide ($Al_4C_3$), gallium carbide ($Ga_4C$), etc.

An example of the Group III-VI compound may include aluminum sulfide ($Al_2S_3$), aluminum selenide ($Al_2Se_3$), aluminum telluride ($Al_2Te_3$), gallium sulfide ($Ga_2S_3$), gallium selenide ($Ga_2Se_3$), indium sulfide ($In_2S_3$), indium selenide ($In_2Se_3$), gallium telluride ($Ga_2Te_3$) or indium telluride ($In_2Te_3$).

An example of the Group IV-VI compound may include lead sulfide (PbS), lead selenide (PbSe), lead telluride (PbTe), tin sulfide (SnS), tin selenide (SnSe) or tin telluride (SnTe), etc.

In one example, each of the inorganic nano-particles may have a core/shell structure. Each of the core and shell of the inorganic nano-particles may be made of the above-exemplified compounds. The above-exemplified compound may be used alone or in combination with at least one further above-exemplified compound to form the core or the shell. A bandgap of the compound constituting the core may be narrower than a bandgap of the compound constituting the shell. The present invention is not limited thereto.

However, when the inorganic nano-particle has a core/shell structure, the compound constituting the shell may be different from the compound constituting the core. For example, the inorganic nano-particle may have a CdZnS/ZnS (core/shell) structure having a core containing CdZnS and a shell containing ZnS. As another example, the inorganic nano-particle may have a core/multi-shell structure having at least two or more shells. For example, the inorganic nano-particle may have CdZnS/ZnS/ZnS (core/first shell/second shell) structure. That is, the structure may include a core comprising CdZnS, a first shell surrounding the surface of the core and including ZnS, and a second shell surrounding the surface of the first shell and including ZnS. The inorganic nano-particle may have a single structure, not the core/shell structure. In this case, the single structure may be composed of only the group II-VI compound.

The inorganic nanoparticle may further include a cluster molecule as a seed. The cluster molecule is a compound that acts as a seed in the process of producing the inorganic nanoparticle. Precursors of the compound constituting the inorganic nanoparticle grow on the cluster molecule. As a result, the inorganic nano-particle may be formed.

During the inorganic nanoparticle producing process as described above, a ligand is coordinated to the surface of the inorganic nano-particle. To be specific, X of the ligand including the component expressed by the above formula 1 is coordinated to the surface of the inorganic nano-particle. The ligand compound prevents adjacent inorganic nano-particles from coagulating each other and quenching, thereby stabilizing the inorganic nano-particles. The ligand compound may bind to the inorganic nano-particles and thus have hydrophobicity. In this way, the inorganic nano-particles-based structure containing the ligand compound may be formed.

Examples of the ligand compound may include an amine compound, thiol compound, ester compound, or carboxylic acid compound having an alkyl group having 6 to 30 carbon atoms. Examples of the amine compound having the alkyl group may include hexadecylamine or octylamine, and the like. Another example of the ligand compound may include an amine compound or a carboxylic acid compound having an alkenyl group having 6 to 30 carbon atoms.

Alternatively, the ligand compound may include a phosphine compound including trioctylphosphine, triphenolphosphine, t-butylphosphine, and the like; phosphine oxide such as trioctylphosphine oxide; pyridine or thiophene, etc.

Alternatively, the ligand compound may include a silane-based compound having at least one functional group selected from a vinyl group, an aryl group, an acrylic group, an amine group, a methacrylate group, and an epoxy group. In this case, the ligand compound may have an alcohol group at a terminal thereof.

Alternatively, the ligand compound may include a polymer having a molecular weight of 1,000 to 500,000 and having a urethane bond formed via reaction between an isocyanate group with an alcohol group.

At least portions of the component having the structure represented by the chemical formula 1 and the ligand compound as exemplified above may exchange with each other. In the inorganic nanoparticles-based structure according to the present disclosure, a content of the component having the structure represented by the chemical formula 1 may be in a range of about 1 to about 95 wt % with respect to a total weight of the ligand coordinated to the surface of the inorganic nano-particle.

In other words, a content of the component having the structure represented by the chemical formula 1 may be in a range of about 1 to about 95 wt % with respect to a total weight of the ligand coordinated to the surface of the inorganic nano-particle.

In this connection, a content of the ligand compound other than the component having the structure represented by the chemical formula 1 may be in a range of about 5 to about 99% by weight with respect to a total weight of the ligand coordinated to the surface of the inorganic nano-particle.

In one example, the weight-average molecular amount of the component having the structure as represented by the chemical formula 1 may be in a range of about 1,000 to about 500,000. When the weight average molecular amount of the component having the structure represented by the chemical formula 1 is smaller than about 1,000, there is almost no modification effect of the ligand on the surfaces of inorganic nano-particles because the ligand does not contain sufficient functional groups. Conversely, when the weight average molecular amount is above about 500,000, the inherent electrical and optical properties of inorganic nano-particles may deteriorate due to too long-repeating units.

In one embodiment, the inorganic nanoparticles may be luminescent particles that absorb ultraviolet light or visible light and, in response, emit visible light of 400 nm to 750 nm.

In one embodiment, the size of each of the inorganic nano-particles may be in a range of 0.5 to 40 nm. In one example, the size of each of the inorganic nano-particles may be in a range of 1 to 30 nm.

The inorganic nanoparticles-based structure according to the present disclosure as illustrated above may include the ligand coordinated to the surfaces of the inorganic nano-particles, wherein the ligand may include the component having the structure represented by the chemical formula 1 in addition to a conventional stabilizing compound. Thus, this may improve compatibility of the inorganic nanoparticles-based structure to many applications thereof. In the synthesis of the inorganic nano-particles, a compound having an alcohol group and a compound having a thiol group are introduced as a ligand material. Then, a separately-synthesized compound may react with the alcohol group on the inorganic nano-particles surface to form a new ligand structure with a urethane bond.

This ligand modification alter may the property of the inorganic nanoparticle to be adapted to the application thereof. In particular, the compatibility thereof with other compositions may be increased when the inorganic nanoparticles-based structure is used to form a film. Further, when producing a light emitting diode, more smooth flow of electric charge may be induced in the inorganic nanoparticles-based structure.

In one embodiment, a thin film according to the present disclosure may be formed by exposing, to light, a mixture containing the inorganic nanoparticle-based structure according to the present disclosure and a photo-initiator.

The thin film may include the inorganic nanoparticles-based structure according to the present disclosure, wherein the inorganic nanoparticles-based structure includes the inorganic nanoparticles, and the ligand coordinated onto the surfaces of the inorganic nanoparticles, wherein the ligand contains the component having the structure represented by the chemical formula 1. Thus, the film may be curable only using the photo-initiator alone and, thus, the curability thereof may be excellent. Thus, the pattern manufactured using the photo mask may be not collapsed in the film formation.

In one embodiment, an optical member, a light emitting device and a quantum dot display device according to the present disclosure may be produced. Each of the optical member, the light emitting device and the quantum dot display device according to the present disclosure may include the inorganic nanoparticles-based structure according to the present disclosure, wherein the inorganic nanoparticles-based structure includes the inorganic nanoparticles, and the ligand coordinated onto the surfaces of the inorganic nanoparticles, wherein the ligand contains the component having the structure represented by the chemical formula 1. Thus, each of the optical member, the light emitting device and the quantum dot display device may be curable only using the photo-initiator alone and, thus, the curability thereof may be excellent. Thus, the pattern thereof manufactured using the photo mask may be not collapsed.

Particularly, the inorganic nanoparticles-based structure according to the present disclosure may be easily mixed and uniformly dispersed in the polymer solution used to form the film. This may allow easy producing of the film having the light conversion property. Furthermore, the inorganic nanoparticles-based structure according to the present disclosure may be stably applied to the light-emitting device that renders white light.

Hereinafter, a production of the inorganic nanoparticles-based structure according to one embodiment of the present disclosure will be described with reference to specific producing examples. Preferable examples of the present disclosure will be described in more detail. The following examples may be merely illustrative but may not be limiting. The following examples are only one example of the present disclosure, and the present disclosure is not limited to the following examples.

SYNTHESIS EXAMPLE 1

Producing Green Light-Emitting Inorganic Nano-Particles

Specifically, 0.05 g of indium acetate (Aldrich company), 0.38 g of zinc acetate (Aldrich company), 1.45 g of oleic acid (Aldrich company), and 15 mL of 1-octadecene (Aldrich company) were input in a 50 mL three-openings round flask coupled to a reflux device, to obtain a mixture. The mixture was heated to 110 degrees C. and maintained at about 0.1 torr using a vacuum pump for 1 hour. The vacuum was removed therefrom and $N_2$ gas was charged into the mixture and then heated to 280 degrees C. Then, 0.43 g of tris(trimethylsilyl)phosphine (Gelest company) was added to the mixture at once.

Then, 0.07 g of sulfur (Aldrich company) was dissolved in 1 ml of trioctyl phosphine to prepare a solution. This solution was added to the reactor containing the mixture. Thereby, a second mixture is obtained. The temperature of the reactor was lowered to 240 degrees C. and held for 3 hours. The mixture was cooled to the room temperature.

Then, a mixture of 2 mL of 1-dodecanethiol (Aldrich company) and 1 mL of 6-mercaptohexanol (Aldrich company) was added to the second mixture to obtain a third mixture. Then, the third mixture was further stirred for 30 minutes.

To the third mixture was added 100 mL of ethanol (Aldrich company), which was stirred for 5 minutes. Then, precipitates were obtained by using a centrifuge. As a result, powders were obtained.

Then, the powders were dissolved in toluene (Aldrich company) at a concentration of 10 wt % to form a solution having dispersed powders therein, in which, in turn, 2-isocyanatoethyl methacrylate 1 ml was added and stirred for 1 hour. Thus, green light-emitting inorganic nano-particles were produced.

The green light-emitting inorganic nano-particles thus obtained were analyzed using an Absolute PL quantum yield spectrometer QE-2100 instrument available from Otsuka electronics company.

From the analysis, the measured quantum yield was 48%; the measured photoluminescence $1_{max}$ was 550 nm; the measured FWHM (Full Width of Half Max) was 62 nm. A particle size of each of the obtained luminescent inorganic nanoparticles (example 1) was measured using a TEM (JEOL company/JEM-3010). It was confirmed that the size was about 6 nm.

SYNTHESIS EXAMPLE 2

Producing Green Light-Emitting Inorganic Nano-Particles

Specifically, 0.05 g of indium acetate (Aldrich company), 0.38 g of zinc acetate (Aldrich company), 1.45 g of oleic acid (Aldrich company), and 15 mL of 1-octadecene (Aldrich company) were input in a 50 mL three-openings round flask coupled to a reflux device, to obtain a mixture. The mixture was heated to 110 degrees C. and maintained at about 0.1 torr using a vacuum pump for 1 hour. The vacuum was removed therefrom and $N_2$ gas was charged into the mixture and then heated to 280 degrees C. Then, 0.43 g of tris(trimethylsilyl)phosphine (Gelest company) was added to the mixture at once.

Then, 0.07 g of sulfur (Aldrich company) was dissolved in 1 ml of trioctyl phosphine to prepare a solution. This solution was added to the reactor containing the mixture. Thereby, a second mixture is obtained. The temperature of the reactor was lowered to 240 degrees C. and held for 3 hours. The mixture was cooled to the room temperature.

To the mixture was added 100 mL of ethanol (Aldrich company), which was stirred for 5 minutes. Then, precipitates were obtained by using a centrifuge. As a result, powders were obtained.

Then, the powders were dissolved in toluene (Aldrich company) at a concentration of 10 wt %. Thus, green light-emitting inorganic nano-particles were produced.

The green light-emitting inorganic nano-particles thus obtained were analyzed using an Absolute PL quantum yield spectrometer QE-2100 instrument available from Otsuka electronics company.

From the analysis, the measured quantum yield was 45%; the measured photoluminescence $1_{max}$ was 548 nm; the measured FWHM (Full Width of Half Max) was 68 nm. A particle size of each of the obtained luminescent inorganic nanoparticles (example 1) was measured using a TEM (JEOL company/JEM-3010). It was confirmed that the size was about 5 nm.

Then, dispersions of the inorganic nanoparticles obtained using the synthesis example 1 and the synthesis example 2 were mixed with photo-initiator at mixing ratios as shown in the following table. The mixtures were stirred for about 30 minutes. Present Example and Comparative Example were prepared.

TABLE 1

| Example | Inorganic nanoparticle dispersion from synthesis example 1 | Inorganic nanoparticle dispersion from synthesis example 2 | Photo-initiator: Irgacure 369(BASF Company) |
|---|---|---|---|
| Present example | 3 g | — | 0.09 g |
| Comparative example | — | 3 g | 0.09 g |

The solution of Present example and the solution of Comparative example were coated on a glass substrate of about 10 cm×10 cm size. Specifically, the coating was performed at 300 RPM for about 10 seconds using a spin coater. Then, the substrate having the coated solutions thereon was subjected to pre-baking for 1 minute on a hot plate at about 100° C. Subsequently, the substrate was exposed at 80 mJ using an exposure apparatus (MA-6/SUSS company) and a photo-mask. Then, the substrate was dipped in 200 ml of toluene for about 10 seconds. As a result, it was observed that a pattern was formed.

FIG. 1 is a view showing a pattern manufactured using Present example. Referring to FIG. 1, it was confirmed that the inorganic nanoparticle-based structure having a ligand according to the present disclosure as prepared by Present example reacted with the photo-initiator through the optical mask to form a UC-cured portion corresponding to a pattern. Specifically, it was confirmed that 8 um line and space and 15 um hole pattern were formed without residue. However, in the case of the comparative example, it was confirmed that the inorganic nanoparticle-based structure was totally dissolved in toluene such that no pattern is not defined.

Therefore, the inorganic nanoparticles-based structure according to the present disclosure has excellent curability. Using the inorganic nanoparticles-based structure according to the present disclosure may solve the problem that the pattern is collapsed by the solution coated after the pattern formation in the prior art.

The inorganic nanoparticles-based structure according to the present disclosure as illustrated above may include the ligand coordinated to the surfaces of the inorganic nano-particles, wherein the ligand may include the component having the structure represented by the chemical formula 1 in addition to the conventional stabilizing compound. Thus, this may improve compatibility of the inorganic nanoparticles-based structure to many applications thereof.

In the synthesis of the inorganic nano-particles, a compound having an alcohol group and a compound having a thiol group are introduced as a ligand material. Then, a separately-synthesized compound may react with the alcohol group on the inorganic nano-particles surface to form a new ligand structure with a urethane bond.

In other words, each of the thin film, optical member, light emitting device, electroluminescent diode and quantum dot display device according to the present disclosure may include the inorganic nanoparticles-based structures, wherein the inorganic nanoparticles-based structure has a novel ligand having a urethane bond resulting from the reaction with an isocyanate compound having a double bond, and, thus, having a double bond at terminals thereof.

This ligand modification alter may the property of the inorganic nanoparticle to be adapted to the application thereof. In particular, the compatibility thereof with other compositions may be increased when the inorganic nanoparticles-based structure is used to form a film. Further, when producing a light emitting diode, more smooth flow of electric charge may be induced in the inorganic nanoparticles-based structure.

The thin film may include the inorganic nanoparticles-based structure according to the present disclosure, wherein the inorganic nanoparticles-based structure includes the inorganic nanoparticles, and the ligand coordinated onto the surfaces of the inorganic nanoparticles, wherein the ligand contains the component having the structure represented by the chemical formula 1. Thus, the film may be curable only using the photo-initiator alone and, thus, the curability thereof may be excellent. Thus, the pattern manufactured using the photo mask may be not collapsed in the film formation.

The optical member, light emitting device and quantum dot display device according to the present disclosure may be produced. Each of the optical member, the light emitting device and the quantum dot display device according to the present disclosure may include the inorganic nanoparticles-based structure according to the present disclosure, wherein the inorganic nanoparticles-based structure includes the inorganic nanoparticles, and the ligand coordinated onto the surfaces of the inorganic nanoparticles, wherein the ligand contains the component having the structure represented by the chemical formula 1. Thus, each of the optical member, the light emitting device and the quantum dot display device may be curable only using the photo-initiator alone and, thus, the curability thereof may be excellent. Thus, the pattern thereof manufactured using the photo mask may be not collapsed.

Particularly, in the inorganic nanoparticle-based structure in accordance with the present disclosure, the ligand having the double bond is coordinated on the surface of the inorganic nanoparticle, thereby improving the curability of the structure. Thus, the structure may be cured using only a photo-initiator or a thermal-initiator.

Moreover, particularly, the inorganic nanoparticles-based structure according to the present disclosure may be easily mixed and uniformly dispersed in the polymer solution used to form the film. This may allow easy producing of the film having the light conversion property. Furthermore, the inorganic nanoparticles-based structure according to the present disclosure may be stably applied to the light-emitting device that renders white light.

In the above description, numerous specific details are set forth in order to provide a thorough understanding of the present disclosure. The present disclosure may be practiced without some or all of these specific details. Examples of various embodiments have been illustrated and described above. It will be understood that the description herein is not intended to limit the claims to the specific embodiments described. On the contrary, it is intended to cover alternatives, modifications, and equivalents as may be included within the spirit and scope of the present disclosure as defined by the appended claims.

What is claimed is:

1. An inorganic nanoparticles-based structure including:
inorganic nano-particles; and
a ligand coordinated to a surface of each of the inorganic nano-particles, wherein the ligand contains a component having a structure represented by a following chemical formula 1:

[Chemical formula 1]

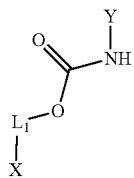

where X represents —SH, —P=OO, —C=OO or —HN$_2$;

L$_1$ represents an alkylene group having 1 to 20 carbon atoms, a cycloalkyl group having 3 to 15 carbon atoms, an aryl group having 3 to 15 carbon atoms, or a heteroarylene group having 3 to 15 carbon atoms;

at least one hydrogen atom of the alkylene group is substituted or unsubstituted with a cycloalkyl group having 3 to 15 carbon atoms, an aryl group having 3 to 15 carbon atoms, or a heteroarylene group having 3 to 15 carbon atoms;

Y represents a following chemical formula 2 or chemical formula 3:

[Chemical formula 2]

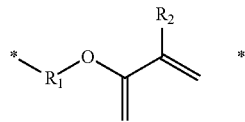

[Chemical formula 3]

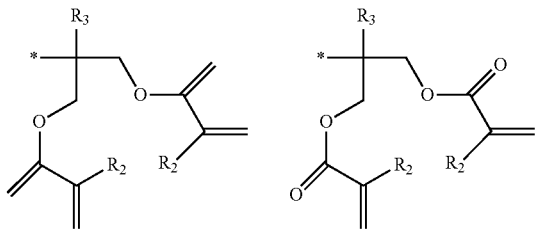

in the chemical formulas 2 and 3,

R$_1$ represents an alkylene group having 1 to 20 carbon atoms;

R$_2$ and R$_3$ each independently represents hydrogen, an alkyl group having 1 to 10 carbon atoms or an aryl group having 3 to 15 carbon atoms.

2. The inorganic nanoparticles-based structure of claim 1, wherein a content of the component represented by the chemical formula 1 is in a range of about 1 wt % to about 95 wt % with respect to a total weight of the ligand coordinated to the surface of the inorganic nano-particle.

3. The inorganic nanoparticles-based structure of claim 1, wherein the inorganic nanoparticle has a diameter of 0.5 nm to 40 nm.

4. A thin film, wherein the film is formed by exposing, to light, a mixture between the inorganic nanoparticles-based structure of claim 1 and photo-initiator.

5. An optical member comprising the inorganic nanoparticles-based structure of claim 1.

6. A light-emitting device comprising the inorganic nanoparticles-based structure of claim 1.

7. A quantum-dot display device comprising the inorganic nanoparticles-based structure of claim 1.

* * * * *